US008597428B2

(12) United States Patent
Brown et al.

(10) Patent No.: US 8,597,428 B2
(45) Date of Patent: Dec. 3, 2013

(54) VACUUM SEALING RADIO FREQUENCY (RF) AND LOW FREQUENCY CONDUCTING ACTUATOR

(75) Inventors: Danny Brown, Brentwood, CA (US); Allan Ronne, Santa Clara, CA (US); Arthur Sato, San Jose, CA (US); John Daugherty, Fremont, CA (US); Leonard Sharpless, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1030 days.

(21) Appl. No.: 12/333,819

(22) Filed: Dec. 12, 2008

(65) Prior Publication Data

US 2009/0152958 A1 Jun. 18, 2009

Related U.S. Application Data

(60) Provisional application No. 61/013,178, filed on Dec. 12, 2007.

(51) Int. Cl.

| | |
|---|---|
| ***C23C 16/00*** | (2006.01) |
| ***H01J 7/24*** | (2006.01) |
| ***H05B 31/26*** | (2006.01) |
| ***B60P 1/00*** | (2006.01) |
| ***B65F 1/00*** | (2006.01) |
| ***B65F 3/00*** | (2006.01) |

(52) U.S. Cl.
USPC ................. 118/715; 315/111.21; 315/111.31; 315/111.41; 315/111.51; 315/111.61; 315/111.71; 315/111.81; 414/443; 414/516; 414/517

(58) Field of Classification Search
USPC ........ 315/111.21–111.81; 414/443, 516, 517; 118/715
See application file for complete search history.

(56) References Cited

U.S. PATENT DOCUMENTS

| | | | | |
|---|---|---|---|---|
| 4,335,060 | A * | 6/1982 | Alegre et al. | 261/23.1 |
| 5,079,481 | A * | 1/1992 | Moslehi | 315/111.41 |
| 6,373,015 | B1 * | 4/2002 | Marchand et al. | 218/139 |
| 6,422,172 | B1 * | 7/2002 | Tanaka et al. | 118/723 R |
| 7,147,719 | B2 * | 12/2006 | Welch et al. | 118/715 |
| 2006/0060302 | A1 * | 3/2006 | White et al. | 156/345.28 |

* cited by examiner

*Primary Examiner* — Keath Chen
(74) *Attorney, Agent, or Firm* — Schwegman Lundberg & Woessner, P.A.

(57) ABSTRACT

A linear actuator comprised of an actuator body having a first portion and a second portion, each arranged along a longitudinal axis of the actuator body. A vacuum bellows is concentrically located in the first portion and is configured to seal a vacuum environment from the second portion. A linear motion shaft is concentrically located substantially within the actuator body and is configured to move in a linear direction along the longitudinal axis. An electrically conductive portion of the shaft is concentrically located substantially within the vacuum bellows and electrically insulated therefrom and is configured to receive and conduct a signal. A lift force generating portion of the shaft is concentrically located substantially within the second portion. An electrical contact pad is electrically coupled to the conductive portion of the shaft and is configured to couple the signal to another surface upon activation of the shaft.

25 Claims, 5 Drawing Sheets

VACUUM SEALING RADIO FREQUENCY (RF) AND LOW FREQUENCY CONDUCTING ACTUATOR

CROSS-REFERENCE TO RELATED APPLICATIONS

This application claims the benefit of U.S. Provisional Application Ser. No. 61/013,178 filed Dec. 12, 2007 and entitled "Vacuum Sealing Radio Frequency (RF) and Low Frequency Conducting Actuator," the content of which is incorporated by reference herein in its entirety.

TECHNICAL FIELD

The present invention relates generally to an apparatus for semiconductor processing. More particularly, the present invention relates to an actuator mechanism operable in a vacuum environment and electrically conductive of radio frequency (RF) or low frequency energy.

BACKGROUND

Semiconductor device geometries have dramatically decreased in size since such devices were first introduced several decades ago. Since then, integrated circuits have generally followed "Moore's Law." Moore's Law dictates that the number of electronic devices which will fit on an integrated circuit doubles every two years. Today's wafer fabrication facilities are routinely producing 65 nm and 45 nm feature size devices on 300 mm wafers. Fabrication facilities are already being planned incorporating even smaller design rules on 450 mm wafers.

As device feature sizes become smaller and integration density increases, issues not previously considered crucial by the semiconductor industry are becoming of greater concern. For example, process tools must be increasingly capable of handling large wafer sizes with extremely small features designed and fabricated thereon. Additionally, the process tools must function properly in a high vacuum environment containing highly corrosive gases and frequently operating in a plasma. These challenging issues must also be met in a tool with increasingly demanding values of metrics such as mean-time-to-failure (MTTF), mean-time-to-clean (MTTC), and mean-time-to-repair (MTTR).

One of the primary steps in fabricating modern semiconductor devices is forming various layers, including dielectric layers and metal layers, on a semiconductor substrate. As is well known, these layers can be deposited by chemical vapor deposition (CVD) or physical vapor deposition (PVD). In a conventional thermal CVD process, reactive gases are supplied to the substrate surface where heat-induced chemical reactions (homogeneous or heterogeneous) take place to produce a desired film. In a plasma-enhanced CVD (PECVD) process, a controlled plasma is formed to decompose and/or energize reactive species to produce the desired film.

In general, reaction rates in thermal and plasma processes may be controlled by controlling one or more of the following: temperature, pressure, plasma density, reactant gas flow rate, power frequency, power levels, chamber physical geometry, and others. In an exemplary PVD system, a target (a plate of the material that is to be deposited) is connected to a negative voltage supply (direct current (DC) or radio frequency (RF)) while a substrate holder facing the target is either grounded, floating, biased, heated, cooled, or some combination thereof. A gas, such as argon, is introduced into the PVD system, typically maintained at a pressure between a few millitorr (mtorr) and about 100 mtorr, to provide a medium in which a glow discharge can be initiated and maintained. When the glow discharge is started, positive ions strike the target, and target atoms are removed by momentum transfer. These target atoms subsequently condense into a thin film on the substrate, which is on the substrate holder. Thus, coupling of RF energy ((e.g., 400 KHz, 2 MHz, 13.56 MHz, etc.) to various electrically conductive surfaces in a vacuum environment, such as electrostatic chucks and plasma containment liners, is critically important.

Additionally, silicon etch applications are extremely critical because they may be used to form, for example, transistor gates, the outcome of which determines the performance of the finished device. As a result, gate etch carries stringent process requirements for critical dimension (CD) uniformity, defectively, and micro-loading in isolated and dense areas. In addition, in-situ processing capability and applications, such as shallow trench isolation (STI) and spacer formation, require a large process window. In situ processing enables advanced applications such as STI etch, and increases the efficiency of gate etch when backside antireflective coating (BARC) and mask open as well as the main etch are performed in the same chamber. In-situ processing increases productivity, requiring fewer processing steps, reducing wafer moves, and lowering transfer overhead.

Increasingly stringent requirements for fabricating these high integration devices are needed and conventional processing tools and associated components used both in and with the tools are becoming inadequate to meet these requirements. Additionally, as device designs evolve, more advanced capabilities are required process tools to implement these devices. For example, components and mechanisms forming various process tools must be increasingly robust in increasingly hostile operating environments.

SUMMARY OF THE INVENTION

In an exemplary embodiment, the present invention is a high frequency linear actuator comprised of an actuator body having a first portion and a second portion. The first and second portions are each arranged along a longitudinal axis of the actuator body. A vacuum bellows is concentrically located in the first portion of the actuator body and is configured to seal a vacuum environment communicated within the vacuum bellows from the second portion of the actuator body. A linear motion shaft is concentrically located substantially within the actuator body and is configured to move in a linear direction along the longitudinal axis of the actuator body. An electrically conductive portion of the linear motion shaft is concentrically located substantially within the vacuum bellows and electrically insulated from the vacuum bellows. The electrically conductive portion of the linear motion shaft is configured to receive and conduct a high frequency signal. A lift force generating portion of the linear motion shaft is concentrically located substantially within the second portion of the actuator body. An electrical contact pad is in electrical communication with the electrically conductive portion of the linear motion shaft and is configured to electrically couple to another surface upon activation of the linear motion shaft.

In another exemplary embodiment, the present invention is a high frequency linear actuator comprised of an actuator body having a first portion and a second portion. The first and second portions are each arranged along a longitudinal axis of the actuator body. A vacuum bellows is concentrically located in the first portion of the actuator body and is configured to seal a vacuum environment communicated within the vacuum bellows from the second portion of the actuator body.

A linear motion shaft is concentrically located substantially within the actuator body and is configured to move in a linear direction along the longitudinal axis of the actuator body. An electrically conductive portion of the linear motion shaft is concentrically located substantially within the vacuum bellows and electrically insulated from the vacuum bellows. The electrically conductive portion of the linear motion shaft is configured to receive and conduct a high frequency signal. A lift force generating portion of the linear motion shaft is concentrically located substantially within the second portion of the actuator body. A radio frequency connection bar electrically coupled to the electrically conductive portion of the linear motion shaft, the radio frequency connection bar configured to be electrically coupled to an external radio frequency energy source. An electrical contact pad is in electrical communication with the electrically conductive portion of the linear motion shaft and is configured to electrically couple to another surface upon activation of the linear motion shaft.

In another exemplary embodiment, the present invention is a high frequency linear actuator comprised of an actuator body having a first portion and a second portion. The first and second portions are each arranged along a longitudinal axis of the actuator body. A vacuum bellows is concentrically located in the first portion of the actuator body and is configured to seal a vacuum environment communicated within the vacuum bellows from the second portion of the actuator body. A linear motion shaft is concentrically located substantially within the actuator body and is configured to move in a linear direction along the longitudinal axis of the actuator body. An electrically conductive portion of the linear motion shaft is concentrically located substantially within the vacuum bellows and electrically insulated from the vacuum bellows. The electrically conductive portion of the linear motion shaft is configured to receive and conduct a high frequency signal. A lift force generating portion of the linear motion shaft is concentrically located substantially within the second portion of the actuator body. An electrical contact pad is in electrical communication with the electrically conductive portion of the linear motion shaft and is configured to electrically couple to another surface upon activation of the linear motion shaft. A fixed electrical contact point is configured to be electrically coupled to the electrical contact pad and provide radio frequency energy thereto depending upon a location of the linear motion shaft. The fixed electrical contact point configured to be electrically coupled to an external radio frequency energy source.

DETAILED DESCRIPTION

The present invention covers various designs of a high frequency electrical energy conducting linear actuator. The linear actuator is capable of sealing between vacuum and atmosphere as well as providing a low impedance electrically conductive path between one end of the actuator shaft and a ground point at some point along the actuator shaft. The actuator is specifically designed to provide a low impedance path for high frequency energy through a linear motion shaft over a motion range of, for example, between 0 to 2.5 inches.

Figure 1A:
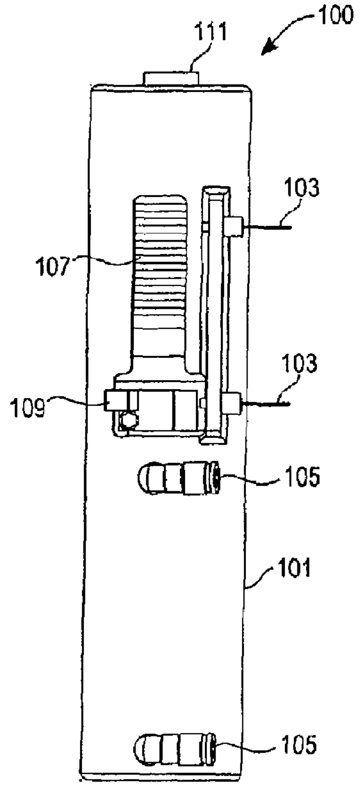
FIG. 1A is a front view of an exemplary embodiment of a high frequency electrical energy conducting linear actuator of the present invention.

With reference to FIG. 1A, a front view 100 of an exemplary embodiment of the high frequency electrical energy conducting linear actuator of the present invention includes an actuator body 101, a plurality of motion sensors 103, a plurality of pneumatic couplings 105, and a vacuum bellows 107. Additionally, the linear actuator further includes an RF connection bar 109 and an upper electrical contact pad 111.

The actuator body 101 may be formed from various materials such as aluminum (e.g., T6061), stainless steel (e.g., 316L), or various other metals. Additionally, the actuator body may be formed from nonconductive materials such as alumina ($Al_2O_3$) or Delrin® or a variety of other materials capable of being formed or otherwise machined with sufficient tolerances to ensure proper activation of an internal actuator shaft, described below. Depending upon a chosen operating environment, the actuator body 101 may be formed from various non-corrosive materials known in the art as well.

The plurality of motion sensors 103 may be optical sensors, Hall effect sensors, or various other types of sensors known to one of skill in the art. The plurality of motion sensors allow determination of a position of the linear actuator through the RF connection bar in proximity to one of the plurality of motion sensors 103.

The plurality of pneumatic couplings 105 are readily available from various suppliers such as Swagelok® (Solon, Ohio, USA), Eaton/Aeroquip (Maumee, Ohio, USA), Parker Hannifin (Cleveland, Ohio), or a variety of other manufacturers. The plurality of pneumatic couplings 105 include both quick coupling connectors or semi-permanent connectors. Depending upon a particular application, the plurality of pneumatic couplings 105 may be chosen to be compatible with ultra-clean environments such as semiconductor fabrication facilities of, for example, Class 10 or better. In other applications, the plurality of pneumatic couplings 105 may be substituted with hydraulic couplings or other connector types arranged so as to allow movement of an actuator shaft, described below, within the actuator body 101.

The vacuum bellows 107 may be constructed from various materials including metals such as AISI 316 L, AM 350, Inconel®, or another corrosion resistant bellows material known to one of skill in the art. In certain applications, the vacuum bellows 107 may need to withstand ultra-high vacuum environments and materials for construction of the vacuum bellows may be chosen accordingly.

Figure 1B:
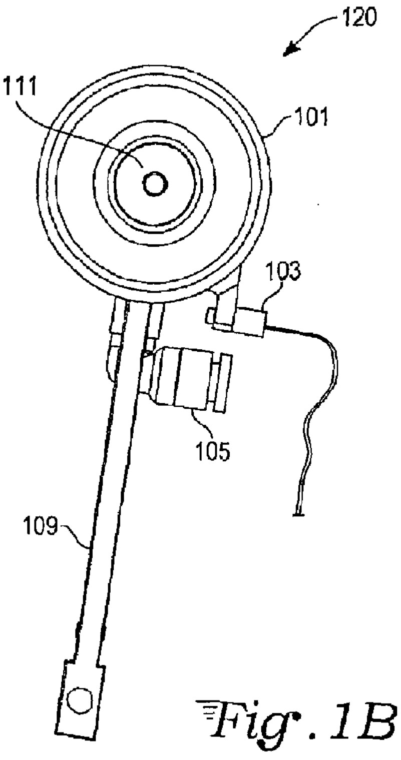
FIG. 1B is a top view of the exemplary high frequency electrical energy conducting linear actuator of the present invention of FIG. 1A.

With reference to FIG. 1B, a top view 120 of the high frequency electrical energy conducting linear actuator provides a relative overview of the RF connection bar 109 with relation to other components of the exemplary embodiment of the linear actuator. The RF connection bar 109 provides an electrical contact point through which an RF energy conduit or strapping (not shown) may be coupled. The RF connection bar 109 may be fabricated from any material capable of readily conducting high frequency energy. As is evident to a skilled artisan, electrical energy of frequencies other than RF may readily be conducted through the RF connection bar 109 as well.

The upper electrical contact pad 111 provides an electrical contact point at an uppermost portion of an actuator shaft, discussed below. The upper electrical contact pad 111 may be constructed as a corrosion resistant pad from various electrically conductive materials such as nickel, rhodium, iridium, or similar high corrosion resistance and electrically conductive metal. The upper electrical contact pad 111 is operably arranged to electrically couple RF energy supplied from the RF connection bar 109 to various contact points.

For example, in a specific exemplary embodiment, the upper electrical contact pad 111 is formed to conduct RF electrical energy to a liner designed for either plasma containment and electrical symmetry, geometric symmetry and electrical symmetry, high gas conductance with electrical symmetry, chamber wall protection with electrical symmetry, or any combination of the above. The plasma containment system is frequently a component of various types of semiconductor fabrication tools, such as a plasma-enhanced chemical vapor deposition (PECVD) system, plasma etchers, or other tools known in the semiconductor art. Forming the upper electrical contact pad 111 from a high corrosion resistance material allows the actuator electrical contact to survive the highly corrosive chemistries that exist inside of, for example, an etch reactor chamber without protection from a device such as an o-ring or other isolating material (not shown).

Figure 1C:
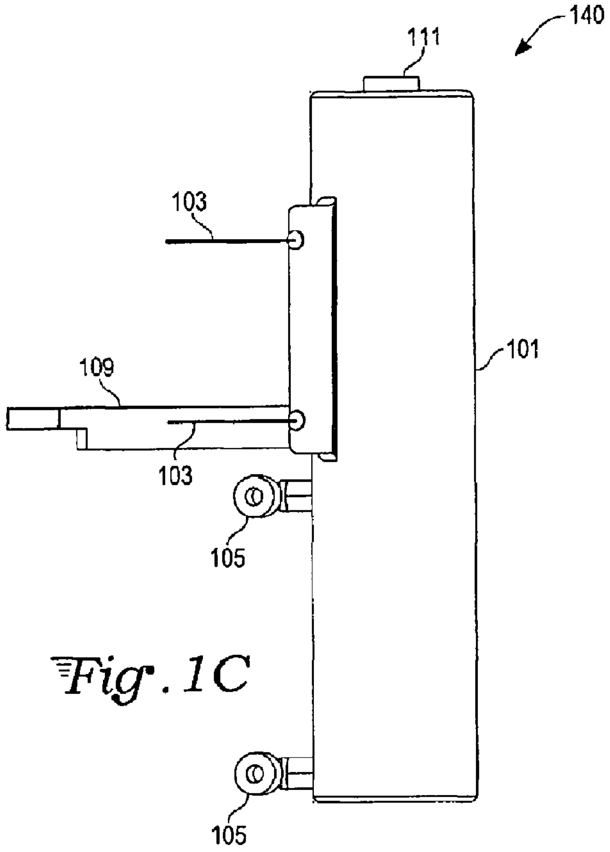
FIG. 1C is a side view of the exemplary high frequency electrical energy conducting linear actuator of the present invention of FIG. 1A.
Figure 1D:
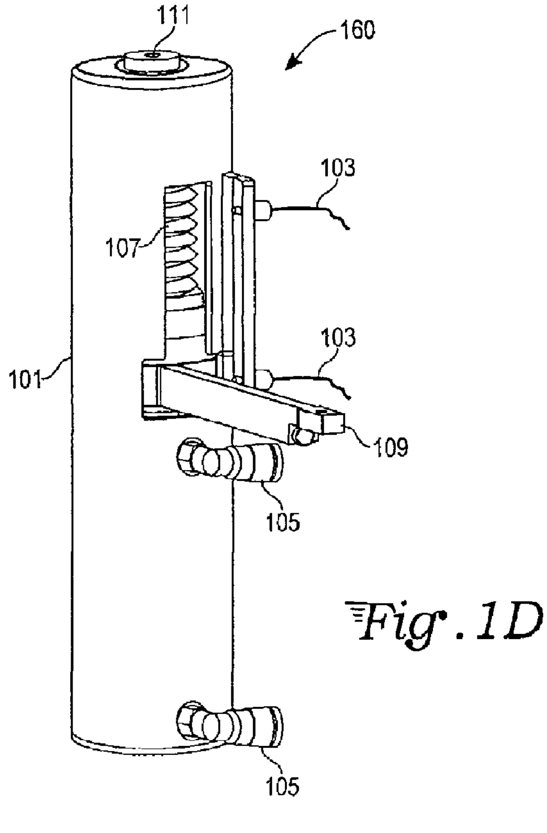
FIG. 1D is an isometric view of the exemplary high frequency electrical energy conducting linear actuator of the present invention of FIG. 1A.

FIGS. 1C and 1D show, respectively, a side view 140 and an isometric view 160 view of the high frequency electrical energy conducting linear actuator of the present invention. A combination of FIGS. 1A-1D allow a skilled artisan to readily envision various components, along with their relative interactions and placements, of exemplary embodiments described herein.

Figure 2:
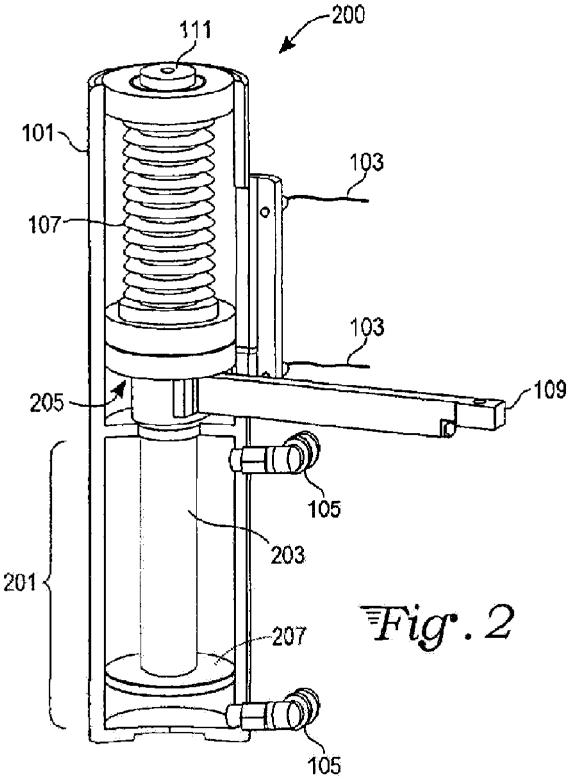
FIG. 2 is a cutaway isometric view indicating details of a moving ground strap configuration of the exemplary high frequency electrical energy conducting linear actuator of FIGS. 1A-1D.

Referring now to FIG. 2, an exemplary embodiment of a moving ground strap configuration 200 is shown with particular components cut-away for clarity. Specifically, an actuator section 201 of the high frequency electrical energy conducting linear actuator contains a movable actuator shaft 203. A lower section 207 of the movable actuator shaft 203 is tightly fitted against an inner surface of a lower portion of the actuator body 101 allowing, for example, pressurized gas coupled through one of the plurality of pneumatic couplings 105 to force the movable actuator shaft 203 through a range of linear motion. The lower section 207 is therefore a lift force generating portion of the movable actuator shaft 203. The lower section of the movable actuator shaft 203 may be tightly fitted against the inner wall of the actuator body with an o-ring.

In a specific exemplary embodiment, the movable actuator shaft 203 is composed of anodized aluminum. The anodized aluminum provides both a low resistivity electrical path (due to the electrically conductive nature of aluminum) coupled with a high corrosion resistance due to the anodized surface of the movable actuator shaft 203. The anodize itself may be, for example, a type III hard anodize, a mixed acid anodize, an oxalic acid anodize, or some other tough, highly corrosion resistant anodized coatings. The movable actuator shaft 203 interfaces with the vacuum bellows 107 through an electrically insulating flange 205. The electrically insulating flange 205 may be formed from various dielectric materials (e.g., ceramic or plastic) and may be either glued or in some way attached (e.g., bolted with an o-ring or tightly press fit) to the movable actuator shaft 230 thereby providing a vacuum seal. The electrically insulating flange 205 ensures that the RF energy travels only through the actuator shaft and not through the vacuum bellows 107 thus ensuring a controlled, highly consistent electrical path.

In another specific exemplary embodiment, once RF energy is routed through the electrical insulating flange 205 (i.e., once through the vacuum barrier), the electrical path may be split from the movable actuator shaft 203 through an interface bracket (not shown but readily envisioned) that has a mounting tie-in point for a conductive flexible strap. The conductive flexible strap can then be routed to a desired grounding point yet still allow the movable actuator shaft 203 to move in the designed linear directions. Below the strap tie-in point is the lift force generating portion of the movable actuator shaft 203. Above the tie-in point, a surface of the movable actuator shaft 203 is free of complicated features or torturous electrical paths in order to minimize an overall electrical impedance. However, below the tie-in point there is freedom to incorporate various materials (conductive or not), and alter the geometry in ways that would create a high impedance path for conducting RF energy.

In a specific exemplary embodiment where various materials are employed as described immediately above, the movable actuator shaft 203 may be formed in two sections—a non-conductive lower portion contained within the actuator section 201 and a conductive portion contained within the vacuum bellows 107 and in direct electrical communication with both the RF connection bar 109 and the upper electrical contact pad 111. By allowing the lower portion to be constructed from a non-conductive material in certain applications, lower production costs may be realized. Additionally, the RF energy may be more readily conducted and contained within a more direct path to the upper electrical contact pad 111.

Figure 3:
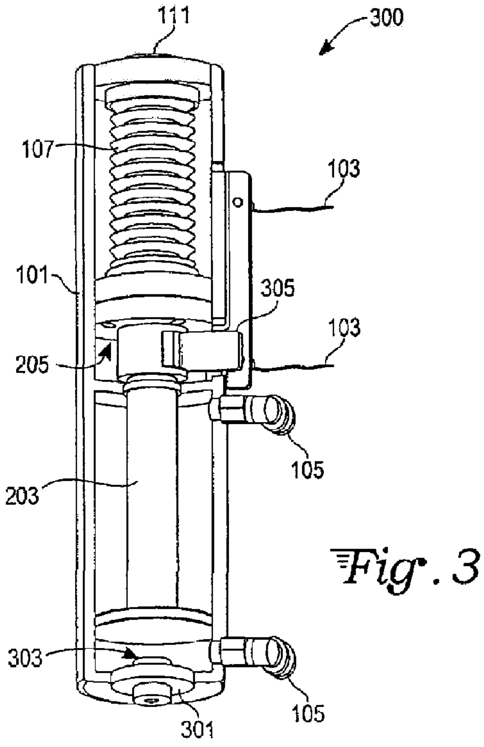
FIG. 3 is a cutaway isometric view indicating details of a fixed ground strap configuration in an alternate exemplary embodiment of the high frequency electrical energy conducting linear actuator.

With reference to FIG. 3, an alternative exemplary embodiment of the high frequency electrical energy conducting linear actuator shows a fixed ground strap configuration 300. In the fixed ground strap configuration 300, electrical contact of the RF energy is coupled to a conductive surface only while the linear actuator is in an operating position (i.e., wherein the movable actuator shaft 203 is either retracted or extended depending on a particular application of the device). In the fixed ground strap configuration 300, no strap is required and electrical contact is established through the movable actuator shaft 203 through a fixed contact pad 303 that is then attached to an RF grounding plane through fixed contacts. The fixed contact pad 303 is isolated from the actuator body 101 by an electrical body insulator 301 such that an RF current path is not allowed to travel through any components other than those defined by the engineered ground path of the assembly. Since electrical connections to the linear actuator are made through the fixed contact pad 303, the RF connection bar 109 (FIG. 2) is not required. Instead, a shaft height indicator 305 allows the plurality of motion sensors 103 to determine a position of the linear actuator.

Figure 4:
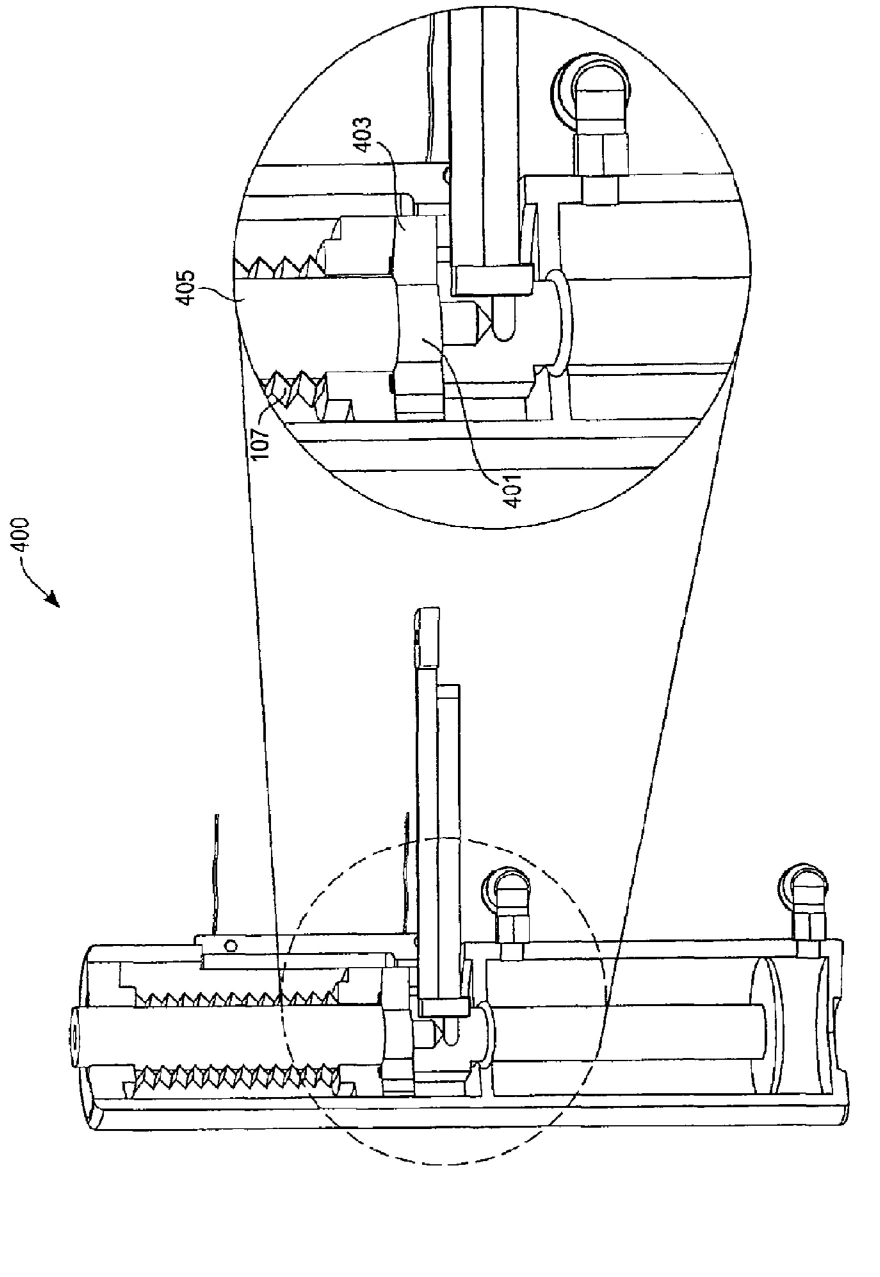
FIG. 4 is a cutaway isometric view indicating exemplary ground path details of the high frequency electrical energy conducting linear actuator.

Referring now to FIG. 4, a cutaway section 400 indicates exemplary details of the ground path insulation in a specific embodiment. The cutaway section 400 includes an RF ground shaft 405, a vacuum seal 401 at the RF ground shaft 405, and a ceramic insulator 403 providing electrical insulation between the RF ground shaft 405 and other components of the linear actuator. Each of these components is readily understood by one of skill in the art.

Figure 5:
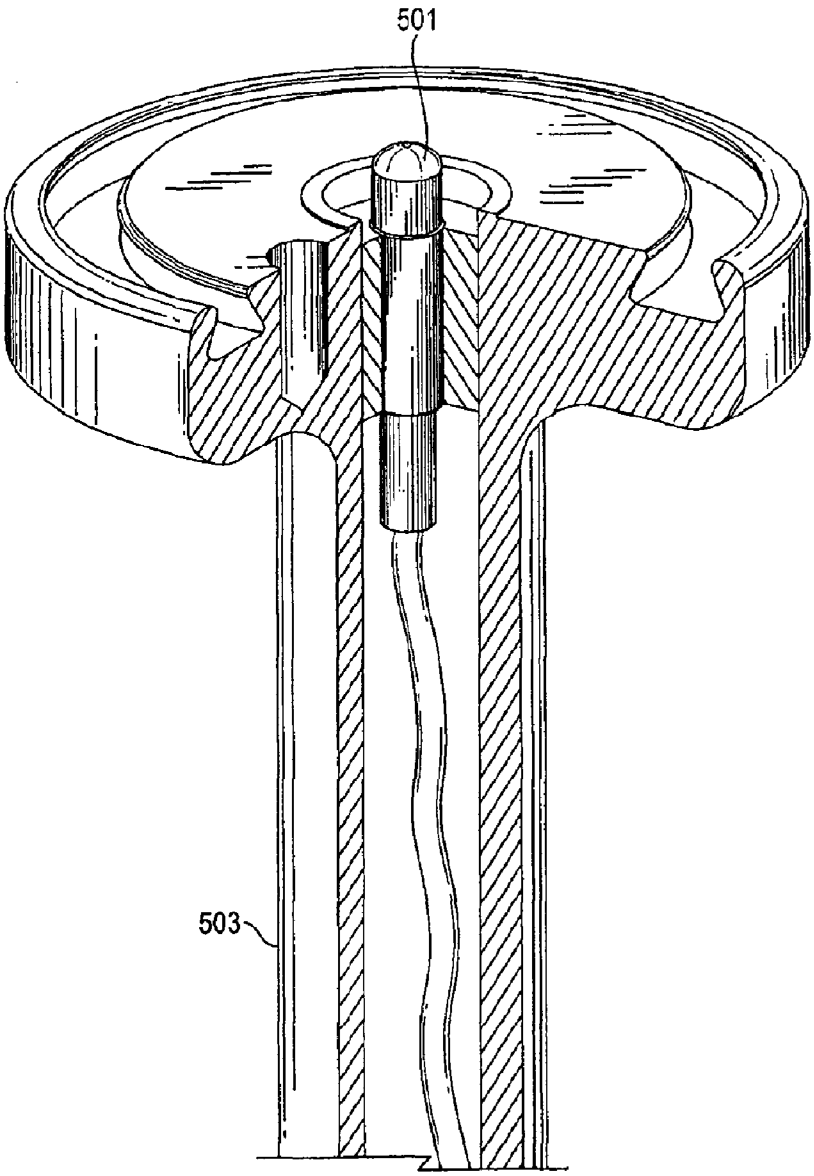
FIG. 5 is an isometric view of an exemplary low frequency electrical energy conducting linear actuator.

In an exemplary embodiment of FIG. 5, the high frequency electrical energy conducting linear actuator described in various embodiments above may additionally be used to supply low frequency power to various devices including, for example, heaters and other portions of semiconductor equipment. Low frequency, in this context, may include 60 Hz, DC, and a variety of other typically low frequency ranges.

In a specific exemplary embodiment, power may be supplied to heaters to perform temperature control on a part that is being grounded by various embodiments of actuators described herein. An AC (or DC) power feed 501 may be delivered coaxially thorough the center of an actuator rod 503, isolating vacuum by the use of vacuum and process gas compatible materials (such as alumina or quartz). Additionally, the AC feed path directed through the AC power feed 501 would be electrically isolated from an RF feed path and from a general ground of the system to prevent direct electrical shorts from either RF electricity or AC electricity. The actuator rod 503 may also serve as an RF power feed or return path.

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, various embodiments described utilize particular components and materials to effect a given design used in, for example, semiconductor fabrication tools in a cleanroom environment. However, a skilled artisan will recognize that applications in other environments may not require particular materials such as the high corrosion resistant contact pads. Other applications, such as a linear actuator not located within the cleanroom environment but rather, a service chase, may not require ultra-high purity connections and couplings to be employed. Further, relative sizes and dimensions of components shown and described may be varied. Each of these applications and materials are recognizable to a skilled artisan.

Additionally, many industries allied with the semiconductor industry could make use of the vacuum sealing conducting linear actuator of the present invention. For example, a thin-film head (TFH) process in the data storage industry or an active matrix liquid crystal display (AMLCD) in the flat panel display industry could readily make use of the present invention described herein and adapted to processes and tools unique to those industries. The term "semiconductor" should be recognized as including the aforementioned and related industries. These and various other embodiments are all within a scope of the present invention. The specification and drawings are, accordingly, to be regarded in an illustrative rather than a restrictive sense.

What is claimed is:

1. A linear actuator, comprising:

an actuator body having a vacuum bellows portion and an actuator portion, the vacuum bellows portion and the actuator portion arranged adjacent to one another and along a longitudinal axis of the actuator body;

a vacuum bellows concentrically located in the vacuum bellows portion of the actuator body, the vacuum bellows being comprised of a metallic material and configured to seal a vacuum environment communicated within the vacuum bellows from the actuator portion of the actuator body;

a movable actuator shaft concentrically located substantially within the actuator body and configured to move in a linear direction along the longitudinal axis of the actuator body, an electrically conductive portion of the linear motion shaft being configured to receive and conduct electrical supply power, the electrically conductive portion concentrically located substantially within the vacuum bellows and electrically insulated from the vacuum bellows, a lift force generating portion of the linear motion shaft being concentrically located substantially within the actuator portion of the actuator body; and an electrical contact pad in electrical communication with the electrically conductive portion of the linear motion shaft and configured to electrically couple the electrical power to another surface upon activation of the movable actuator shaft.

2. The linear actuator of claim 1 wherein the movable actuator shaft is formed from a material having an electrically low impedance to high frequency energy.

3. The linear actuator of claim 1 further comprising a radio frequency connection bar electrically coupled to the electrically conductive portion of the movable actuator shaft and configured to provide radio frequency energy thereto.

4. The linear actuator of claim 1 further comprising a fixed contact pad, fixed relative to the actuator body, and configured to be electrically coupled to the electrical contact pad and provide radio frequency energy thereto depending upon a location of the movable actuator shaft.

5. The linear actuator of claim 4 wherein radio frequency energy is electrically coupled from the fixed contact pad to the electrical contact pad only when the movable actuator shaft is in an extended position.

6. The linear actuator of claim 4 wherein radio frequency energy is electrically coupled from the fixed contact pad to the electrical contact pad only when the movable actuator shaft is in a retracted position.

7. The linear actuator of claim 1 further comprising motion sensors configured to indicate a position of the movable actuator shaft.

8. The linear actuator of claim 1 wherein the electrically conductive portion of the movable actuator shaft is electrically isolated from the lift force generating portion.

9. The linear actuator of claim 1 wherein the electrically conductive portion of the movable actuator shaft is electrically coupled to the lift force generating portion.

10. The linear actuator of claim 1 wherein the electrically conductive portion of the movable actuator shaft is formed from a material having an electrically low impedance to high frequency energy.

11. A high frequency linear actuator, comprising:

an actuator body having a vacuum bellows portion and an actuator portion, the vacuum bellows portion and the actuator portion arranged adjacent to one another and along a longitudinal axis of the actuator body;

a vacuum bellows concentrically located in the vacuum bellows portion of the actuator body, the vacuum bellows being comprised of a metallic material and configured to seal a vacuum environment communicated within the vacuum bellows from the actuator portion of the actuator body;

a movable actuator shaft concentrically located substantially within the actuator body and configured to move in a linear direction along the longitudinal axis of the actuator body, an electrically conductive portion of the linear motion shaft being configured to receive and conduct a high frequency electrical supply signal, the electrically conductive portion concentrically located substantially within the vacuum bellows and electrically insulated from the vacuum bellows, a lift force generating portion of the linear motion shaft being concentrically located substantially within the actuator portion of the actuator body;

a radio frequency connection bar electrically coupled to the electrically conductive portion of the movable actuator shaft, the radio frequency connection bar configured to be electrically coupled to an external radio frequency energy source; and an electrical contact pad in electrical communication with the electrically conductive portion of the linear motion shaft and configured to electrically couple the electrical supply signal to another surface upon activation of the movable actuator shaft.

12. The high frequency linear actuator of claim 11 wherein the movable actuator shaft is formed from a material having an electrically low impedance to high frequency energy.

13. The high frequency linear actuator of claim 11 further comprising motion sensors configured to indicate a position of the movable actuator shaft.

14. The high frequency linear actuator of claim 11 wherein the electrically conductive portion of the movable actuator shaft is electrically isolated from the lift force generating portion.

15. The high frequency linear actuator of claim 11 wherein the electrically conductive portion of the movable actuator shaft is electrically coupled to the lift force generating portion.

16. The high frequency linear actuator of claim 11 wherein the electrically conductive portion of the movable actuator shaft is formed from a material having an electrically low impedance to high frequency energy.

17. A high frequency linear actuator, comprising:

an actuator body having a vacuum bellows portion and an actuator portion, the vacuum bellows portion and the actuator portion arranged adjacent to one another along a longitudinal axis of the actuator body;

a vacuum bellows concentrically located in the vacuum bellows portion of the actuator body, the vacuum bellows being comprised of a metallic material and configured to seal a vacuum environment communicated within the vacuum bellows from the actuator portion of the actuator body;

a movable actuator shaft concentrically located substantially within the actuator body and configured to move in a linear direction along the longitudinal axis of the actuator body, an electrically conductive portion of the linear motion shaft being configured to receive and conduct a high frequency electrical supply signal, the electrically conductive portion concentrically located substantially within the vacuum bellows and electrically insulated from the vacuum bellows, a lift force generating portion of the linear motion shaft being concentrically located substantially within the actuator portion of the actuator body;

an electrical contact pad in electrical communication with the electrically conductive portion of the linear motion shaft and configured to electrically couple to another surface upon activation of the movable actuator shaft; and a fixed contact pad, fixed relative to the actuator body, and configured to be electrically coupled to the electrical contact pad and provide radio frequency energy thereto depending upon a location of the movable actuator shaft, the fixed contact pad configured to be electrically coupled to an external radio frequency energy source.

18. The high frequency linear actuator of claim 17 wherein radio frequency energy is electrically coupled from the fixed contact pad to the electrical contact pad only when the movable actuator shaft is in an extended position.

19. The high frequency linear actuator of claim 17 wherein radio frequency energy is electrically coupled from the fixed contact pad to the electrical contact pad only when the movable actuator shaft is in a retracted position.

20. The high frequency linear actuator of claim 17 wherein the movable actuator shaft is formed from a material having an electrically low impedance to high frequency energy.

21. The high frequency linear actuator of claim 17 further comprising motion sensors configured to indicate a position of the movable actuator shaft.

22. The high frequency linear actuator of claim 17 wherein the electrically conductive portion of the movable actuator shaft is electrically isolated from the lift force generating portion.

23. The high frequency linear actuator of claim 17 wherein the electrically conductive portion of the movable actuator shaft is electrically coupled to the lift force generating portion.

24. The high frequency linear actuator of claim 17 wherein the electrically conductive portion of the movable actuator shaft is formed from a material having an electrically low impedance to high frequency energy.

25. The high frequency linear actuator of claim 17 wherein the fixed contact pad is attached to and electrically isolated from the actuator body.

* * * * *